United States Patent
Hori et al.

[11] Patent Number: 5,864,180
[45] Date of Patent: Jan. 26, 1999

[54] SEMICONDUCTOR DEVICE AND METHOD FOR MANUFACTURING THE SAME

[75] Inventors: Shizue Hori; Yoshiro Baba, both of Yokohama; Hiroyuki Sugaya, Tokyo; Hiroshi Naruse, Yokohama, all of Japan

[73] Assignee: Kabushiki Kaisha Toshiba, Kawasaki, Japan

[21] Appl. No.: 28,672

[22] Filed: Feb. 24, 1998

[30] Foreign Application Priority Data

Feb. 27, 1997 [JP] Japan .................................. 9-043579

[51] Int. Cl.$^6$ ...................................................... H01L 21/36
[52] U.S. Cl. .......................... 257/774; 257/627; 257/923; 438/640; 438/701; 438/429; 438/481
[58] Field of Search ...................................... 257/774, 798, 257/923, 627, 628; 438/455, 637, 638, 639, 640, 701, 429, 481

[56] References Cited

U.S. PATENT DOCUMENTS

| | | | |
|---|---|---|---|
| 4,184,172 | 1/1980 | Raffel et al. | 257/506 |
| 4,467,521 | 8/1984 | Spooner et al. | 257/506 |
| 4,728,624 | 3/1988 | Silvestri et al. | 438/429 |
| 4,834,809 | 5/1989 | Kakihara | 438/481 |
| 5,034,342 | 7/1991 | Sidner et al. | 438/429 |
| 5,317,193 | 5/1994 | Watanabe | 257/774 |
| 5,416,354 | 5/1995 | Blackstone | 257/506 |
| 5,422,299 | 6/1995 | Neudeck et al. | 438/429 |
| 5,589,695 | 12/1996 | Malhi | 257/506 |
| 5,675,185 | 10/1997 | Chen et al. | 257/774 |
| 5,723,895 | 3/1998 | Takahashi | 257/506 |
| 5,746,884 | 5/1998 | Gupta et al. | 156/643.1 |
| 5,777,365 | 7/1998 | Yamaguchi et al. | 257/506 |

*Primary Examiner*—David B. Hardy
*Attorney, Agent, or Firm*—Finnegan, Henderson, Farabow, Garrett & Dunner, L.L.P.

[57] ABSTRACT

A semiconductor device and a method for manufacturing the same, in which a leak current generated in a pn junction formed between a silicon substrate and an epitaxial layer can be reduced. A silicon oxide film is formed on a silicon substrate having a (100) crystal plane. The silicon oxide film is patterned to form an opened portion and an inclined surface on a pattern edge of the silicon oxide film. The inclined surface forms an angle of 54.74±5° with the silicon substrate. An epitaxial layer is formed in the opened portion by selective epitaxial growth.

12 Claims, 3 Drawing Sheets

SEMICONDUCTOR DEVICE AND METHOD FOR MANUFACTURING THE SAME

BACKGROUND OF THE INVENTION

The present invention relates to a semiconductor device and a method for Manufacturing the same, in which a semiconductor layer is formed using selective epitaxial growth on a semiconductor substrate, and more particularly to a semiconductor device and a method for manufacturing the same in which the shape of an oxide film used as a mask for performing selective epitaxial growth is optimized.

FIG. 1 shows a structure of an example of a semiconductor device formed by means of element isolation using selective epitaxial growth.

According to the conventional art, when an N-type silicon substrate 50 having the (100) plane is subjected to selective epitaxial growth using a silicon oxide film ($SiO_2$) 52 as a mask at a high temperature (1000° C.), a pattern edge of the silicon oxide film 52 as shown in FIG. 1 is formed. At this time, a P-type epitaxial layer 54 is grown upward along a silicon monocrystal (100). In other words, the P-type epitaxial layer 54 is grown in the same orientation as that of the silicon substrate 50. Further, a complex layer comprising an epitaxial layer 56 and a polysilicon layer 58, having different orientations, is formed in a boundary portion between the silicon oxide film 52 serving as a mask and the epitaxial layer 54.

It is assumed that the semiconductor device as shown in FIG. 1 constitutes a diode and that a reverse bias is applied to a junction between the N-type silicon substrate 50 and the epitaxial layer 54. In this case, since the complex layer comprising the epitaxial layer 56 and the polysilicon layer 58 is formed in the boundary portion between the silicon oxide film 52 and the epitaxial layer 54 as described above, a great junction leakage current is generated near the pattern edge of the silicon oxide film 52, i.e., in an end portion of the junction. This is because carriers are recombined in that part of the polysilicon layer 58 which is formed near the pattern edge of the silicon oxide film 52.

BRIEF SUMMARY OF THE INVENTION

The present invention has been made to solve the above problem of the conventional art, and has as its object to provide a semiconductor device and a method for manufacturing the same, in which growth of polysilicon in epitaxial growth is suppressed, thereby reducing a leak current generated in a pn junction formed between a silicon substrate and an epitaxial layer.

To achieve the above object, according to a first aspect of the present invention, there is provided a semiconductor device comprising:

an insulation film formed on a first conductive-type semiconductor substrate having a (100) crystal plane, the insulation film having a pattern edge surface forming an interior angle of 54.74±5° with the first conductive-type semiconductor; and a second conductive-type semiconductor layer formed by epitaxial growth method, the second conductive-type semiconductor layer being formed on the first conductive-type semiconductor substrate in contact with the insulation film.

According to a second aspect of the present invention, in the semiconductor device of the first aspect, the second conductive-type semiconductor layer comprises a conductive-type layer in <100> direction and a conductive-type layer in <111> direction.

According to a third aspect of the present invention, there is provided a semiconductor device comprising:

an insulation film formed on a first conductive-type semiconductor substrate having a (100) crystal plane, the insulation film having two pattern edge surfaces forming interior angles of 54.74±5° and 125.26±5° with the first conductive-type semiconductor; and a second conductive-type semiconductor layer formed by epitaxial growth method, the second conductive-type semiconductor layer being formed on the first conductive-type semiconductor substrate in contact with the insulation film.

According to a fifth aspect of the present invention, there is provided a semiconductor device comprising:

an insulation film formed on a first conductive-type semiconductor substrate having a (111) crystal plane, the insulation film having a pattern edge surface forming an interior angle of 38.94±5° with the first conductive-type semiconductor; and a second conductive-type semiconductor layer formed by epitaxial growth method, the second conductive-type semiconductor layer being formed on the first conductive-type semiconductor substrate in contact with the insulation film.

According to a sixth aspect of the present invention, in the semiconductor device of the fifth aspect, the second conductive-type semiconductor layer comprises a conductive-type layer in <111> direction and a conductive-type layer in <111> direction.

According to a seventh aspect of the present invention, there is provided a semiconductor device comprising:

an insulation film formed on a first conductive-type semiconductor substrate having a (111) crystal plane, the insulation film having two pattern edge surfaces forming interior angles of 38.94±5° and 109.47±5° with the first conductive-type semiconductor; and a second conductive-type semiconductor layer formed by epitaxial growth method, the second conductive-type semiconductor layer being formed on the first conductive-type semiconductor substrate in contact with the insulation film.

According to an eighth aspect of the present invention, in the semiconductor device of the seventh aspect, the second conductive-type semiconductor layer comprises a conductive-type layer in <111> direction and a conductive-type layer in <111> direction.

According to a ninth aspect of the present invention, there is provided a method for manufacturing a semiconductor device comprising the steps of:

forming an insulation film on a conductive-type semiconductor substrate having a (100) crystal plane;

patterning the insulation film to form an opened portion and an inclined surface on a pattern edge of the insulation film, the inclined surface forming an angle of 54.74±5° with the conductive-type semiconductor substrate; and forming an epitaxial layer in the opened portion by selective epitaxial growth.

According to a tenth aspect of the present invention, in the method for manufacturing a semiconductor device of the ninth aspect, the opened portion is formed by patterning the insulation film parallel and perpendicular to <110> direction.

According to an eleventh aspect of the present invention, there is provided a method for manufacturing a semiconductor device comprising the steps of:

forming an insulation film on a conductive-type semiconductor substrate having a (111) crystal plane;

patterning the insulation film to form an opened portion and an inclined surface on a pattern edge of the insulation film, the inclined surface forming an angle of 38.94±5° with the conductive-type semiconductor substrate; and forming an epitaxial layer in the opened portion by selective epitaxial growth.

According to a twelfth aspect of the present invention, in the method for manufacturing a semiconductor device of the eleventh aspect, the opened portion is formed by patterning the insulation film parallel and perpendicular to <2-11> direction.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will be described with reference to the accompanying drawings.

Figure 1:
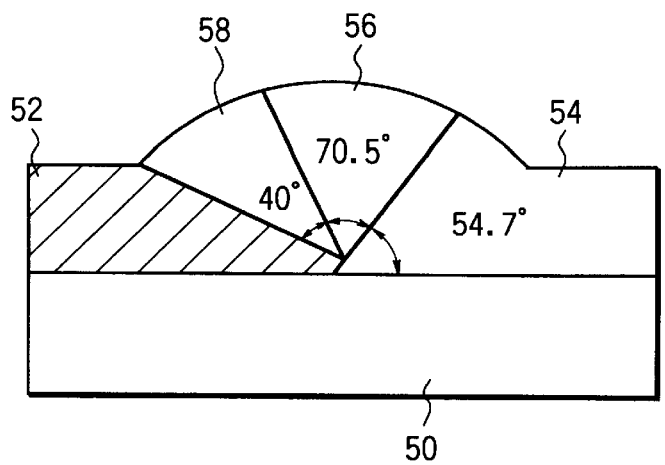
FIG. 1 is a diagram showing a semiconductor device formed by means of element isolation using the conventional selective epitaxial growth.
Figure 2:
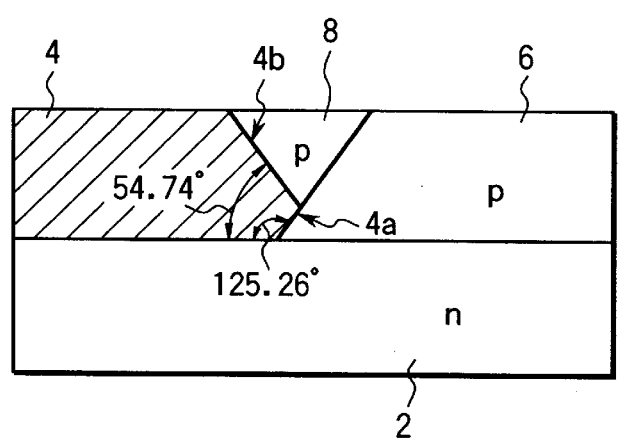
FIG. 2 is a cross-sectional view showing a structure of a semiconductor device according to a first embodiment of the present invention.

FIG. 2 is a cross-sectional view showing a structure of a semiconductor device according to a first embodiment of the present invention.

A silicon oxide film 4 having a thickness of 0.5 μm is formed on the main surface of an N-type silicon substrate 2 of the surface orientation (100). A pattern edge of the silicon oxide film 4 has two surfaces. One surface 4a of the two surfaces, which is in contact with the silicon substrate 2, forms an angle of 125.26±5° with the silicon substrate 2. The other surface 4b of the pattern edge of the silicon oxide film 4 forms an angle of 54.74±5° with the silicon substrate 2.

A P-type epitaxial layer 6 of the <100> orientation is formed in an opened portion of the silicon oxide film 4 on the silicon substrate 2. Further, a P-type epitaxial layer 8 of the <111> orientation is formed between the silicon oxide film 4 and the epitaxial layer 6.

A method for manufacturing the semiconductor device of the first embodiment will now be described.

FIGS. 3A to 3D are cross-sectional views for explaining steps of a method for manufacturing the semiconductor device.

Figure 3A:
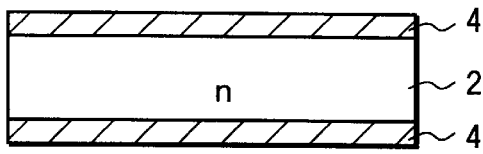
FIGS. 3A to 3D are cross-sectional views for explaining steps of a method for manufacturing a semiconductor device according to the first embodiment of the present invention.

First, as shown in FIG. 3A, an N-type silicon substrate 2 of the surface orientation (100) is subjected to thermal oxidation in an oxidation atmosphere at a high temperature, thereby forming a silicon oxide film ($SiO_2$ film) 4 of a thickness of 0.5 μm.

Figure 3B:
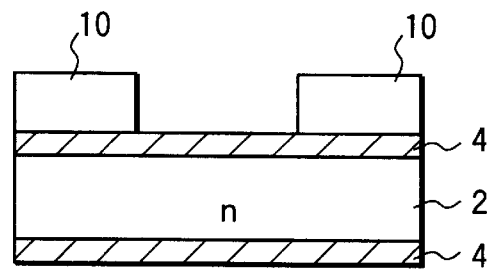
Figure 3C:
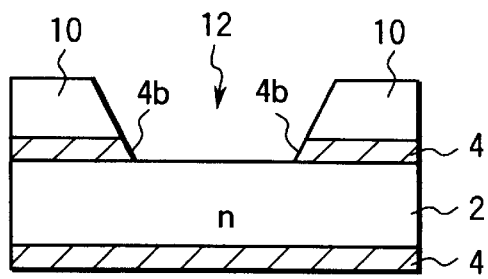

Then, as shown in FIG. 3B, a resist pattern 10 is formed on the silicon oxide film 4 by the normal photolithography. Subsequently, as shown in FIG. 3C, while the aforementioned tapered surface 4b is formed in the pattern edge of the silicon oxide film 4, the silicon oxide film 4 is patterned parallel and perpendicular to the <110> direction, by means of RIE (Reactive Ion Etching). As a result, an opened portion 12 serving as an element forming region is formed.

In the above RIE process, a mixture of $CHF_3$ and oxygen ($O_2$) is used as an etching gas, and etching is executed while the resist pattern 10 is being shifted away from the opened portion 12, so that the angle of the tapered surface 4b of the pattern edge of the silicon oxide film 24 can be controlled to 54.74±5°. The angle of the tapered surface 4b (hereinafter referred to as a taper angle) means the angle formed between the surface 4b of the pattern edge of the silicon oxide film 4 and the silicon substrate 2.

Figure 4:
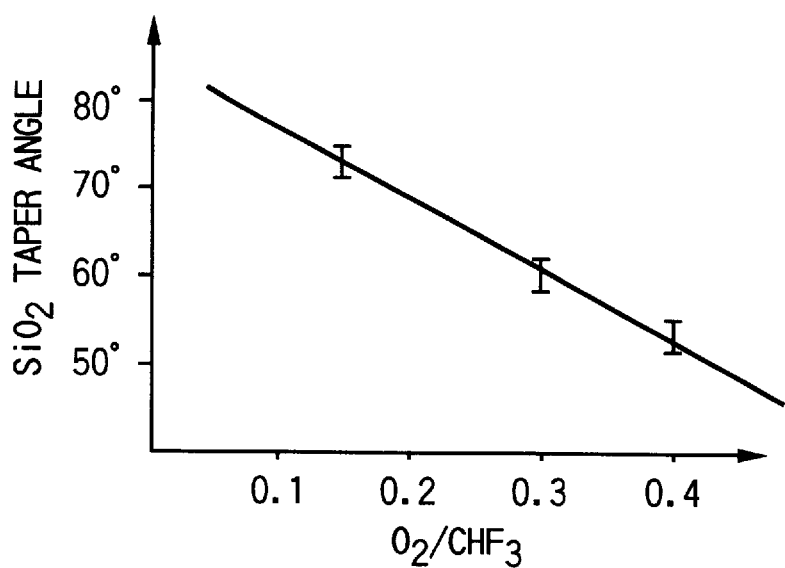
FIG. 4 is a diagram showing the relationship between a flow rate ratio of $O_2/CHF_3$ in RIE and a taper angle.

The taper angle obtained by the RIE has a relationship to a flow rate ratio of $O_2/CHF_3$ as shown in FIG. 4. As clear from FIG. 4, the taper angle is linearly decreased as the flow rate ratio of $O_2/CHF_3$ is increased. Thus, the taper angle can be controlled easily.

Figure 3D:
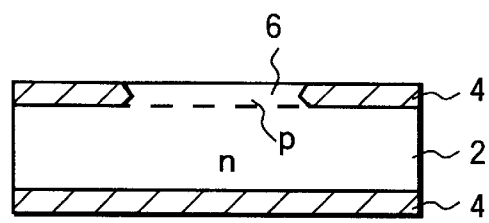

As shown in FIG. 3D, the resist mask 10 is removed, and the substrate is subjected to selective epitaxial growth in $SiH_4$, $B_2H_6$ and $H_2$ gas at 1000° C., thereby forming a P-type epitaxial layer 6 of the <100> orientation in the opened portion 12 on the silicon substrate 2. At this time, a portion of the silicon oxide film 4 near the boundary between the silicon oxide film 4 and the silicon substrate 2 is set back by the growth of the epitaxial layer 6. As a result, a surface 4a making an angle of 125.26±5° with the silicon substrate 2 is formed. The epitaxial layer 6 has a concentration of $10^{17}$ $cm^{-3}$ and a thickness of 0.5 μm.

At the same time, a P-type epitaxial layer 8 of the <111> orientation is formed between the epitaxial layer 6 and the silicon oxide film 4 along the surface 4b of the silicon oxide film 4, as shown in FIG. 2. In other words, the epitaxial layer 8 is formed, leaving no space between the epitaxial layer 6 and the silicon oxide film 4, so that, for example, a polysilicon layer, cannot be formed therebetween.

After the epitaxial layers 6 and 8 are formed, thermal treatment at 1000° C. is executed for 30 minutes, thereby diffusing the P-type layer from the epitaxial layer 6 into the N-type silicon substrate 2 to a depth of about 0.1 μm. The purpose of this diffusion is to prevent carriers from being recombined in the pn junction, when a reverse bias is applied to the junction. Then, the silicon oxide film or the like formed on the rear surface of the silicon substrate 2 is removed.

The pn junction between the epitaxial layer 6 and the silicon substrate 2, in the semiconductor device manufactured in the method described above, is evaluated as follows.

Figure 5:
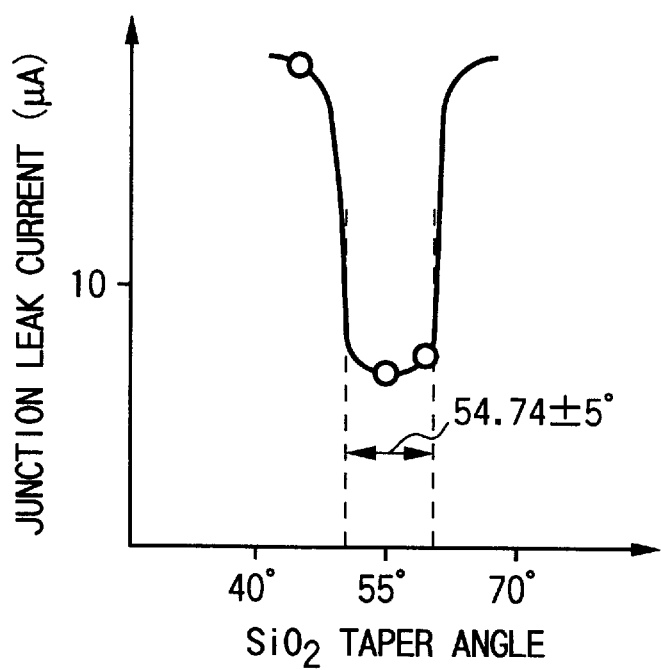
FIG. 5 is a diagram showing a junction leak current corresponding to a taper angle of a silicon oxide film 4 used as a parameter.

FIG. 5 is a diagram showing results of measurement of the junction leak current Ir on a biasing voltage Vr=100[V], when the taper angle (the angle formed between the surface 4b of the pattern edge and the silicon substrate 2) of the silicon oxide film 4 is varied as a parameter. The area of junction in the measurement is 3.3×3.3 mm$^2$.

It was confirmed from FIG. 5 that, as a result of the measurement of the junction leak currents at taper angles 45°, 55° and 60° of the silicon oxide film, the junction leak current was at a minimum when the taper angle was 55°, and kept small within a range of 54.74±5°. When an end portion of the pn junction of the semiconductor device having a taper angle of 54.74° was observed by a transmission electron microscope (TEM), it was confirmed that the portion has a structure as shown in FIG. 2.

More specifically, the epitaxial layer 6 of the (100) orientation is grown on the silicon substrate 2 of the (100) orientation, and a facet is formed on the epitaxial layer 6 at the boundary of the silicon oxide film 4, i.e., near the surface 4a of the silicon oxide film 4. Further, the epitaxial layer 8 of the (100) orientation is grown on the facet, and another facet is formed on a portion of the epitaxial layer near the surface 4b forming an angle of 70.53° with the surface 4a. Since said another facet substantially coincides with the surface 4b of the silicon oxide film 4, there is no space between the silicon oxide film 4 and the epitaxial layer 8 and no other layer, for example, a polysilicon layer, can exist therebetween. In the case where the taper angle of the silicon oxide film 4 is 54.74±5°, it is considered that growth of a polysilicon layer is suppressed for the reason that the growth of the two facets coincide with the silicon oxide film 4, and there is no room for growth of polysilicon.

Thus, according to the first embodiment as described above, the pn junction leak current can be suppressed by processing the silicon oxide film 4 such that the surface 4b of the pattern edge makes an angle of 54.74±5° with the silicon substrate 2.

The patterning of the silicon oxide film 4 is not limited to the directions parallel and perpendicular to the <110> direction; that is, the silicon oxide film 4 need not be patterned along the cleavage plane of the silicon substrate 2. However, it is preferable that the silicon oxide film be patterned in the directions parallel and perpendicular to the <110> direction, since an epitaxial layer having a stable crystal is formed near the boundary between the silicon oxide film 4 and the epitaxial layer more easily, if the silicon oxide film is patterned along the cleavage plane of the silicon substrate 2.

A second embodiment of the present invention will now be described.

Figure 6:
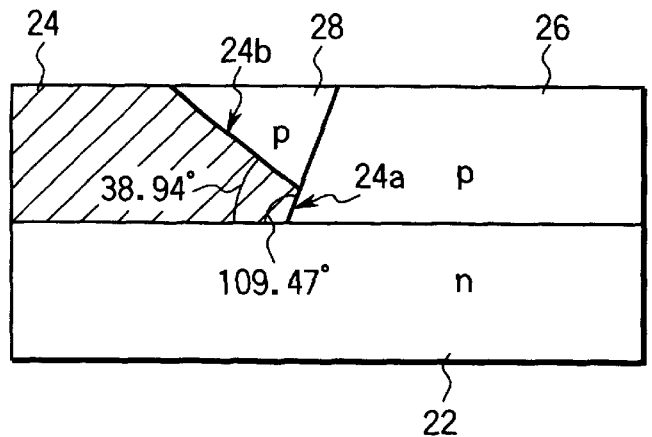
FIG. 6 is a cross-sectional view showing a structure of a semiconductor device according to a second embodiment of the present invention.

FIG. 6 is a cross-sectional view showing a structure of a semiconductor device according to a second embodiment of the present invention.

A silicon oxide film 24 having a thickness of 0.5 μm is formed on the main surface of an N-type silicon substrate 22 of the surface orientation (111). A pattern edge of the silicon oxide film 24 has two surfaces. One surface 24a of the two surfaces, which is in contact with the silicon substrate 22, forms an angle of 109.47±5° with the silicon substrate 22. The other surface 24b of the pattern edge of the silicon oxide film 24 forms an angle of 38.94±5° with the silicon substrate 22.

A P-type epitaxial layer 26 of the <111> orientation is formed in an opened portion of the silicon oxide film 24 on the silicon substrate 22. Further, a P-type epitaxial layer 28 of the <111> orientation is formed between the silicon oxide film 24 and the epitaxial layer 26.

A method for manufacturing the semiconductor device of the second embodiment will now be described.

FIGS. 7A to 7D are cross-sectional views for explaining steps of a method for forming the semiconductor device.

Figures 7A, 7B:
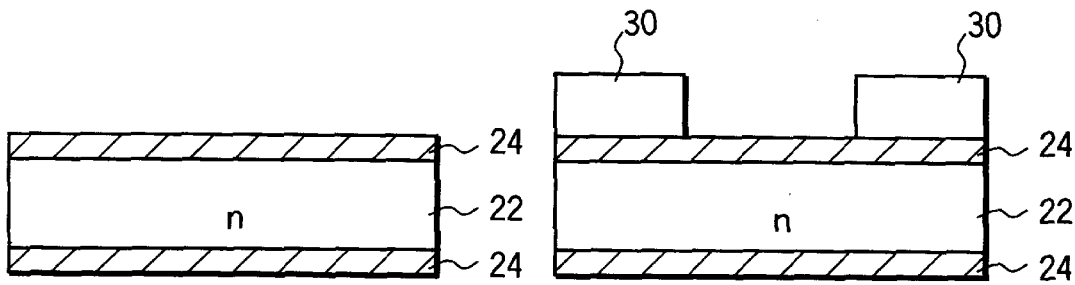
FIGS. 7A to 7D are cross-sectional views for explaining steps of a method for manufacturing a semiconductor device according to the second embodiment of the present invention.

First, as shown in FIG. 7A, an N-type silicon substrate 22 of the surface orientation (111) is subjected to thermal oxidation in an oxidation atmosphere at a high temperature, thereby forming a silicon oxide film (SiO$_2$ film) 24 of a thickness of 0.5 μm.

Figures 7C, 7D:
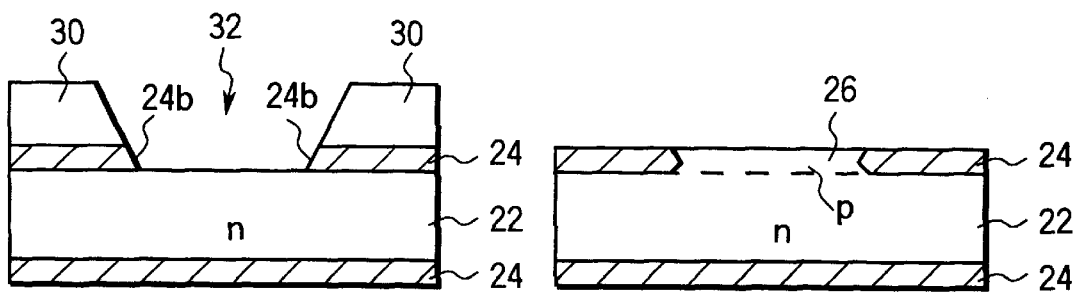

Then, as shown in FIG. 7B, a resist pattern 30 is formed on the silicon oxide film 24 by the normal photolithography. Subsequently, as shown in FIG. 7C, while the aforementioned tapered surface 24b is formed in the pattern edge of the silicon oxide film 24, the silicon oxide film 24 is patterned to form angles of +60° and −60° with the <2-11> direction, by means of RIE. As a result, an opened portion 32 serving as an element forming region is formed.

In the above RIE process, a mixture of CHF$_3$ and oxygen (O$_2$) is used as an etching gas, and etching is executed while the resist pattern 30 is being shifted away from the opened portion 32, so that the angle of the tapered surface 24b of the pattern edge of the silicon oxide film 24 can be controlled to 38.94±5°. The angle of the tapered surface 24b (hereinafter referred to as a taper angle) means the angle formed between the surface 42b of the pattern edge of the silicon oxide film 24 and the silicon substrate 22.

The taper angle obtained by the RIE has a relationship to a flow rate ratio of O$_2$/CHF$_3$ as shown in FIG. 4, as in the first embodiment described above. As clear from FIG. 4, the taper angle is linearly decreased as the flow rate ratio of O$_2$/CHF$_3$ is increased. Thus, the taper angle can be controlled easily.

As shown in FIG. 7D, the resist mask 30 is removed, and the substrate is subjected to selective epitaxial growth in SiH$_4$, B$_2$H$_6$ and H$_2$ gas at 1000° C., thereby forming a P-type epitaxial layer 26 of the <111> orientation in the opened portion 32 on the silicon substrate 22. At this time, a portion of the silicon oxide film 24 near the boundary between the silicon oxide film 24 and the silicon substrate 22 is set back by the growth of the epitaxial layer 26. As a result, a surface 24a making an angle of 109.47±5° with the silicon substrate 22 is formed. The epitaxial layer 26 has a concentration of 10$^{17}$ cm$^{-3}$ and a thickness of 0.5 μm.

At the same time, a P-type epitaxial layer 28 of the <111> orientation is formed between the epitaxial layer 26 and the silicon oxide film 24 along the surface 24b of the silicon oxide film 24, as shown in FIG. 6. In other words, the epitaxial layer 28 is formed, leaving no space between the epitaxial layer 26 and the silicon oxide film 24, so that, for example, a polysilicon layer, cannot be formed therebetween.

After the epitaxial layers 26 and 28 are formed, thermal treatment at 1000° C. for 30 minutes is executed, thereby diffusing the P-type layer from the epitaxial layer 26 into the N-type silicon substrate 22 to a depth of about 0.1 μm. The purpose of this diffusion is to prevent carriers from being recombined in the pn junction, when a reverse bias is applied to the junction. Then, the silicon oxide film or the like formed on the rear surface of the silicon substrate 22 is removed.

When an end portion of the pn junction of the semiconductor device described above having a taper angle of 38.94° was observed by a transmission electron microscope (TEM), it was confirmed that the portion has a structure as shown in FIG. 6.

More specifically, the epitaxial layer 26 of the (111) orientation is grown on the silicon substrate 22 of the (111) orientation, and a facet is formed on the epitaxial layer 26 at the boundary of the silicon oxide film 24, i.e., near the surface 24a of the silicon oxide film 24. Further, the epitaxial layer 28 of the (111) orientation is grown on the facet, and another facet is formed on a portion of the epitaxial layer near the surface 24b forming an angle of 70.53° with the surface 24a. Since said another facet substantially coincides with the surface 24b of the silicon oxide film 24, there is no space between the silicon oxide film 24 and the epitaxial layer 28 and no other layer, for example, a polysilicon layer, can exist therebetween. In the case where the taper angle of the silicon oxide film 24 is 38.94±5°, it is considered that growth of a polysilicon layer is suppressed for the reason that the growth of the two facets coincide with the silicon oxide film 24, and there is no room for growth of polysilicon.

Thus, according to the second embodiment as described above, the pn junction leak current can be suppressed by processing the silicon oxide film 24 such that the surface 24b of the pattern edge makes an angle of 38.94±5° with the silicon substrate 22.

The patterning of the silicon oxide film 24 is not limited to the directions forming +60° and −60° with the <2-11> direction; that is, the silicon oxide film 24 need not be patterned along the cleavage plane of the silicon substrate 22. However, it is preferable that the silicon oxide film be patterned in the directions forming +60° and −60° with the <2-11> direction, since an epitaxial layer having a stable crystal is formed near the boundary between the silicon oxide film 24 and the epitaxial layer more easily, if the silicon oxide film is patterned along the cleavage plane of the silicon substrate 22.

As has been described above, the present invention can provide a semiconductor device and a method for manufacturing the same, in which growth of polysilicon formed in epitaxial growth is suppressed, thereby reducing a leak current generated in a pn junction formed by a silicon substrate and an epitaxial layer.

Further, the silicon substrate is not limited to the P-type silicon substrate. The silicon substrate may be a N-type silicon substrate. That is, it is needed that a junction between the silicon substrate and the epitaxial growth layer forms a PN junction.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A semiconductor device comprising:

an insulation film formed on a first conductive-type semiconductor substrate having a (100) crystal plane, the insulation film having a pattern edge surface forming an interior angle of 54.74±5° with the first conductive-type semiconductor; and a second conductive-type semiconductor layer formed by epitaxial growth method, the second conductive-type semiconductor layer being formed on the first conductive-type semiconductor substrate in contact with the insulation film.

2. The semiconductor device according to claim 1, wherein the second conductive-type semiconductor layer comprises a conductive-type layer in <100> direction and a conductive-type layer in <111> direction.

3. A semiconductor device comprising:

an insulation film formed on a first conductive-type semiconductor substrate having a (100) crystal plane, the insulation film having two pattern edge surfaces forming interior angles of 54.74±5° and 125.26±5° with the first conductive-type semiconductor; and a second conductive-type semiconductor layer formed by epitaxial growth method, the second conductive-type semiconductor layer being formed on the first conductive-type semiconductor substrate in contact with the insulation film.

4. The semiconductor device according to claim 3, wherein the second conductive-type semiconductor layer comprises a conductive-type layer in <100> direction and a conductive-type layer in <111> direction.

5. A semiconductor device comprising:

an insulation film formed on a first conductive-type semiconductor substrate having a (111) crystal plane, the insulation film having a pattern edge surface forming an interior angle of 38.94±5° with the first conductive-type semiconductor; and a second conductive-type semiconductor layer formed by epitaxial growth method, the second conductive-type semiconductor layer being formed on the first conductive-type semiconductor substrate in contact with the insulation film.

6. The semiconductor device according to claim 5, wherein the second conductive-type semiconductor layer comprises a conductive-type layer in <111> direction and a conductive-type layer in <111> direction.

7. A semiconductor device comprising:

an insulation film formed on a first conductive-type semiconductor substrate having a (111) crystal plane, the insulation film having two pattern edge surfaces forming interior angles of 38.94±5° and 109.47±5° with the first conductive-type semiconductor; and a second conductive-type semiconductor layer formed by epitaxial growth method, the second conductive-type semiconductor layer being formed on the first conductive-type semiconductor substrate in contact with the insulation film.

8. The semiconductor device according to claim 7, wherein the second conductive-type semiconductor layer comprises a conductive-type layer in <111> direction and a conductive-type layer in <111> direction.

9. A method for manufacturing a semiconductor device comprising the steps of:

forming an insulation film on a conductive-type semiconductor substrate having a (100) crystal plane;

patterning the insulation film to form an opened portion and an inclined surface on a pattern edge of the insulation film, the inclined surface forming an angle of 54.74±5° with the conductive-type semiconductor substrate; and forming an epitaxial layer in the opened portion by selective epitaxial growth.

10. The method for manufacturing a semiconductor device according to claim 9, wherein the opened portion is formed by patterning the insulation film parallel and perpendicular to <110> direction.

11. A method for manufacturing a semiconductor device comprising the steps of:

forming an insulation film on a conductive-type semiconductor substrate having a (111) crystal plane;

patterning the insulation film to form an opened portion and an inclined surface on a pattern edge of the insulation film, the inclined surface forming an angle of 38.94±5° with the conductive-type semiconductor substrate; and forming an epitaxial layer in the opened portion by selective epitaxial growth.

12. The method for manufacturing a semiconductor device according to claim 11, wherein the opened portion is formed by patterning the insulation film parallel and perpendicular to <2-11> direction.

* * * * *